(12) United States Patent
Ding et al.

(10) Patent No.: US 8,557,615 B2
(45) Date of Patent: Oct. 15, 2013

(54) TCO MATERIALS FOR SOLAR APPLICATIONS

(75) Inventors: Guowen Ding, San Jose, CA (US); Mohd Fadzli Anwar Hassan, San Francisco, CA (US); Hien Minh Huu Le, San Jose, CA (US); Zhi-Wen Sun, San Jose, CA (US)

(73) Assignee: Intermolecular, Inc., San Jose, CA (US)

(*) Notice: Subject to any disclaimer, the term of this patent is extended or adjusted under 35 U.S.C. 154(b) by 95 days.

(21) Appl. No.: 13/310,724

(22) Filed: Dec. 3, 2011

(65) Prior Publication Data
US 2013/0143354 A1   Jun. 6, 2013

(51) Int. Cl.
*H01L 21/00*   (2006.01)

(52) U.S. Cl.
USPC .......................... 438/19; 136/256

(58) Field of Classification Search
USPC ........................... 438/19; 136/256
See application file for complete search history.

(56) References Cited

U.S. PATENT DOCUMENTS

| 8,430,978 B2* | 4/2013 | Inoue et al. ............... 148/403 |
| 2010/0089444 A1* | 4/2010 | Thomsen et al. ............. 136/256 |

OTHER PUBLICATIONS

Tohsophon, T., et al.; Damp Heat Stability and Annealing Behavior of Aluminum Doped Zinc Oxide Films Prepared by Magnetron Sputtering; Feb. 7, 2006; Elsevier B.V.; Thin Solid Films; pp. 673-677.
Fang, L., et al.; Water Electrolysis-Induced Optical Degradation of Aluminum-Doped Zinc Oxide Films; Jun. 15, 2006; Elsevier B.V.; Applied Surface Science; pp. 2547-2550.
Lee, J., et al.; Dependence of the Electrical and Optical Properties on the Bias Voltage for ZnO:Al Films Deposited by r.f. Magnetron Sputtering; Mar. 31, 2007; Elsevier B.V.; Thin Solid Films; pp. 1377-1381.

* cited by examiner

Primary Examiner — William D Coleman

(57) ABSTRACT

A method for forming a transparent conductive oxide (TCO) film for use in a TFPV solar device comprises the formation of a tin oxide film doped with between about 5 volume % and about 40 volume % antimony (ATO). Advantageously, the Sb concentration generally ranges from about 15 volume % to about 20 volume % and more advantageously, the Sb concentration is about 19 volume %. The ATO films exhibited almost no change in transmission characteristics between about 300 nm and about 1100 nm or resistivity after either a 15 hour exposure to water or an anneal in air for 8 minutes at 650 C, which indicated the excellent durability. Control sample of Al doped zinc oxide (AZO) exhibited degradation of resistivity for both a 15 hour exposure to water and an anneal in air for 8 minutes at 650 C.

6 Claims, 5 Drawing Sheets

TCO MATERIALS FOR SOLAR APPLICATIONS

FIELD OF THE INVENTION

The present invention relates generally to methods for developing transparent conductive oxide (TCO) materials for thin film solar cells. More specifically, methods of developing TCO materials for copper indium gallium (sulfide) selenide (CIGS) solar cells, cadmium telluride (CdTe) solar cells, and copper zinc tin (sulfide) selenide (CZTS) solar cells.

BACKGROUND OF THE INVENTION

Solar cells have been developed as clean, renewable energy sources to meet growing demand. Currently, crystalline silicon solar cells (both single crystal and polycrystalline) are the dominant technologies in the market. Crystalline silicon solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long carrier lifetimes to allow the carriers to diffuse to the contacts. Therefore, crystalline silicon solar cell technologies lead to increased costs. Thin film solar cells based on amorphous silicon (a-Si), CIGS, CdTe, CZTS, etc. provide an opportunity to increase the material utilization since only thin films (<10 um) are generally required. CdTe and CZTS films have band gaps of about 1.5 eV and therefore, are efficient absorbers for wavelengths shorter than about 800 nm. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire visible spectrum. The absorption coefficient for CIGS is about $10^5$/cm. Furthermore, thin film solar cells may be fabricated on inexpensive substrates such as glass, plastics, and thin sheets of metal. Among the thin film solar cells, CIGS has demonstrated the best lab cell efficiency (over 20%) and the best large area module efficiency (>12%).

The increasing demand for environmentally friendly, sustainable and renewable energy sources is driving the development of large area, thin film photovoltaic (TFPV) devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet relatively little attention has been devoted to their development and characterization.

Among the TFPV technologies, CIGS and CdTe are the two that have reached volume production with greater than 10% stabilized module efficiencies. Solar cell production volume must increase tremendously in the coming decades to meet sharply growing energy needs. However, the supply of In, Ga and Te may impact annual production of CIGS and CdTe solar panels. Moreover, price increases and supply constraints in In and Ga could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to TFPV using more widely available and more environmentally friendly raw materials should be considered a top priority for research.

The immaturity of TFPV devices exploiting Earth abundant materials represents a daunting challenge in terms of the time-to-commercialization. That same immaturity also suggests an enticing opportunity for breakthrough discoveries. A quaternary system such as CIGS or CZTS requires management of multiple kinetic pathways, thermodynamic phase equilibrium considerations, defect chemistries, and interfacial control. The vast phase-space to be managed includes deposition, and conversion methods, process parameters, source material choices, compositions, and overall integration schemes. Traditional R&D methods are ill-equipped to address such complexity, and the traditionally slow pace of R&D could limit any new material from reaching industrial relevance when having to compete with the incrementally improving performance of already established TFPV fabrication lines.

However, due to the complexity of the material, cell structure and manufacturing process, both the fundamental scientific understanding and large scale manufacturability are yet to be improved for CIGS and CZTS solar cells. As the photovoltaic industry pushes to achieve grid parity, much faster and broader investigation is needed to explore the material, device, and process windows for higher efficiency and a lower cost of manufacturing process. Efficient methods for forming different types of CIGS and CZTS solar cells that can be evaluated are necessary.

The TCO materials for TFPV solar cells must meet a number of requirements such as high conductivity, good ohmic contact to neighboring layers, good adhesion, thermo-mechanically stable during manufacturing and during deployment in the field, low cost, high deposition rate, a coefficient of thermal expansion preferably similar to the substrate and other materials in the TFPV solar cell stack, resistance to moisture, etc. It is difficult to develop a single material that will meet all of these requirements.

Therefore, there is a need to develop TCO materials that address each of the requirements listed above to improve the efficiency of TFPV solar cells. In addition to meeting the required materials properties, the TCO material must also meet the requirements of low cost and ease of manufacturing.

SUMMARY OF THE DISCLOSURE

In some embodiments of the present invention, TCO materials are formed to address each of the requirements listed above. Tin oxide, doped with antimony (ATO) is used to replace aluminum-doped zinc oxide (AZO) or indium-doped tin oxide (ITO) as a TCO material in TFPV devices. The ATO films were deposited using reactive sputtering and were found to exhibit improved durability with respect to moisture exposure and thermal treatment.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

A general class of PV absorber films of special interest is formed as multinary compounds from Groups IB-IIIA-VIA of the periodic table. Group IB includes Cu, Ag, and Au. Group IIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, Cl, Br, I, and At. Other potential absorber materials of interest include cuprous oxide, iron sulfide, etc. As used herein, "CIGS" will be understood to represent the entire range of related alloys denoted by $Cu(In_xGa_{1-x})(S_ySe_{2-y})$ where $0 \leq X \leq 1$ and $0 \leq y \leq 2$. As used herein, "CZTS" will be understood to represent the entire range of related alloys denoted by $Cu_2ZnSn(S_ySe_{1-y})_4$ where $0 \leq y \leq 1$.

Figure 1:
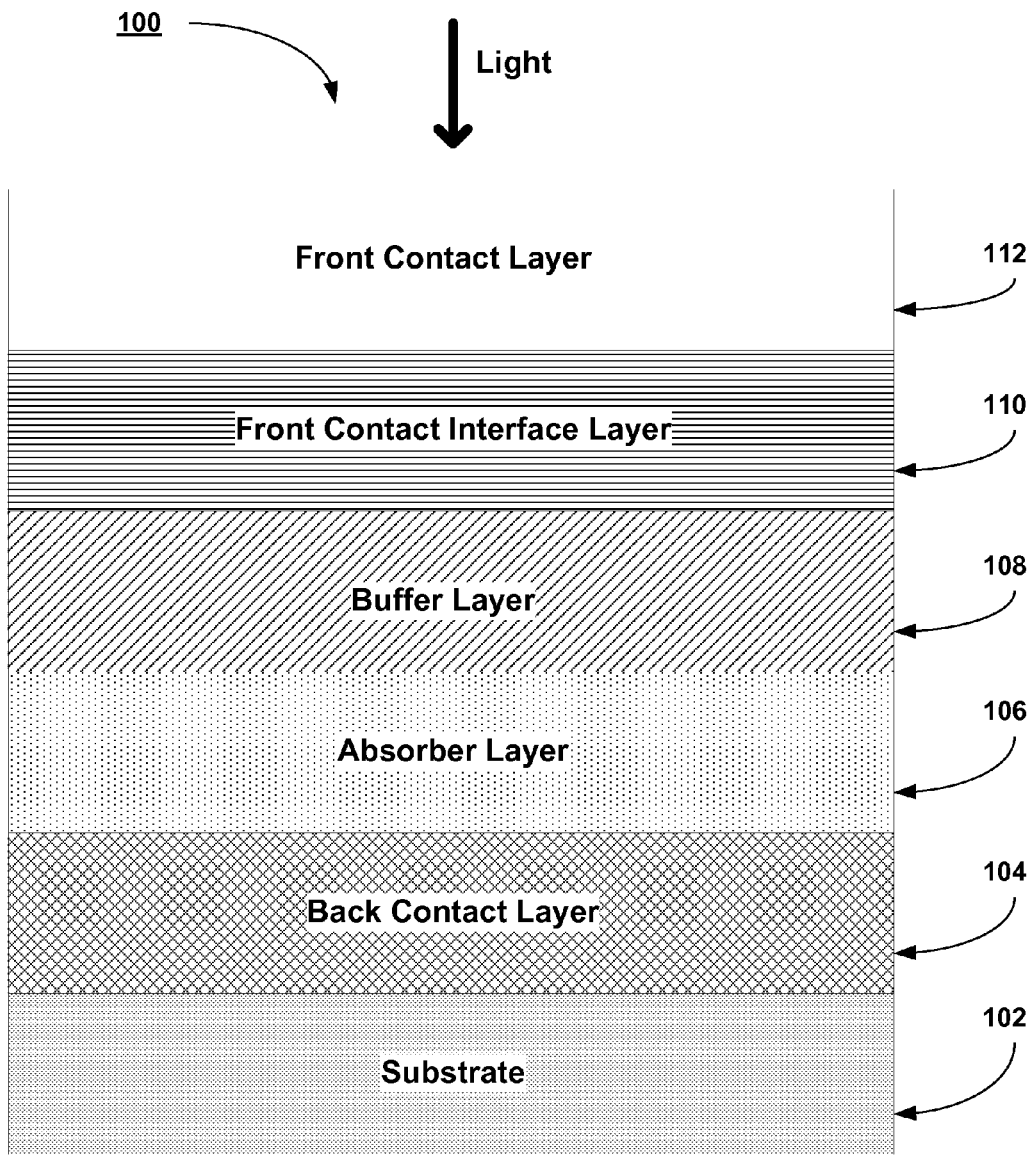
FIG. 1 illustrates a schematic diagram of a simple CIGS or CZTS TFPV stack according to an embodiment described herein.

In FIG. 1 below, a TFPV material stack is illustrated using a simple planar structure. Those skilled in the art will appreciate that the description and teachings to follow can be readily applied to any simple or complex TFPV solar cell structure. The drawings are for illustrative purposes only and do not limit the application of the present invention.

FIG. 1 illustrates a schematic diagram of a simple TFPV solar cell stack consistent with some embodiments of the present invention. The convention will be used wherein light is assumed to be incident upon the top of the material stack as illustrated. This generic diagram would be typical of either a CIGS TFPV solar cell or a CZTS TFPV solar cell. The difference being the choice of materials for the absorber layer. A back contact layer, 104, is formed on a substrate, 102. TFPV devices may be fabricated on inexpensive substrates such as glass, plastics, and thin sheets of metal. Examples of suitable substrates comprise float glass, low-iron glass, borosilicate glass, flexible glass, specialty glass for high temperature processing, stainless steel, carbon steel, aluminum, copper, polyimide, plastics, etc. Typically, suitable substrates comprise soda lime glass (SLG). An example of a suitable back contact layer material is Mo. The back contact layer is typically formed using a physical vapor deposition (PVD—specifically sputtering) process but may also be formed using an evaporation process. The thickness of the back contact layer is typically between about 0.3 um and about 1.0 um.

A p-type absorber layer, 106, of CIGS or CZTS is then deposited on top of the back contact layer. The absorber layer may be formed using a variety of techniques such as PVD, co-evaporation, printing or spraying of inks, CVD, etc. Advantageously, the absorber layer is deficient in Cu. The Cu deficiency may be controlled by managing the deposition conditions. Advantageously, a small amount of Na is contained in the absorber layer. The Na may be added by out-diffusion from the SLG substrate or may be purposely added in the form of a sodium salt like NaF or $Na_2Se$, prior, during, or after the deposition of the precursor or final absorber layer. Optionally, the absorber layer undergoes a selenization process after formation to fill the Se vacancies within the matrix. The selenization process involves the exposure of the absorber layer to $H_2Se$, Se vapor, or diethylselenide (DESe) at temperatures between about 400 C. and 600 C. During the selenization process, a layer of $MoSe_2$ (not shown) forms at the back contact/absorber layer interface and forms a good ohmic contact between the two layers. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 108, is then deposited on top of the absorber layer or optional $MoSe_2$ layer if present. Examples of suitable n-type buffer layers comprise CdS, ZnS, CdZnS, $In_2S_3$, $In_2(S,Se)_3$, Zn(O,S), etc. CdS is the material most often used as the n-type buffer layer in CIGS or CZTS TFPV solar cells. The buffer layer may be deposited using chemical bath deposition (CBD), chemical surface deposition, ion-layer-gas-reaction (ILGAR), ALD, PVD (sputtering), ink deposition, spraying, electro-plating, or evaporation. The thickness of the buffer layer is typically between about 50 nm and about 80 nm, but can be as thin as 5-20 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell. The iZnO layer makes the TFPV solar cell less sensitive to lateral non-uniformities caused by differences in composition or defect concentration in the absorber and/or buffer layers. The iZnO layer is typically between about 30 nm and 80 nm in thickness. The iZnO layer is typically formed using a reactive PVD (sputtering) technique or CVD technique, but can be electro-plated, deposited by ink, or deposited by chemical surface deposition, chemical bath deposition, or other means. A low resistivity top TCO layer, 112, (examples include Al:ZnO (AZO), InSnO (ITO), InZnO, B:ZnO, Ga:ZnO, F:ZnO, F:$SnO_2$, etc.) is formed on top of the iZnO layer. The top TCO layer is typically between about 0.3 um and 2.0 um in thickness. The top TCO layer is typically formed using a reactive PVD (sputtering) technique or CVD technique, but other techniques, like electro-plating or ink deposition are used as well.

Two TCO materials are currently used in high volume manufacturing of TFPV solar devices, namely Al:ZnO (AZO), InSnO (ITO). ITO is expensive due to the scarcity of the In component. Additionally, the In has high toxicity. The AZO material is sensitive to exposure to moisture. The goal is to fabricate TFPV devices that have lifetimes greater than about 25 to 30 years. If the AZO material is exposed to moisture, the properties degrade and the TFPV device performance decreases.

In some embodiments of the present invention, a TCO material comprising antimony-tin-oxide (Sb:SnO—ATO) is developed for use as a TCO material in a TFPV device. The ATO material is developed using reactive sputtering, but can also be deposited using reactive evaporation, CVD, or CBD as discussed earlier with respect to the other TCO materials. The Sb concentration generally ranges from about 5 volume % to about 40 volume % calculated as Sb/(Sb+Sn) volume %. Advantageously, the Sb concentration generally ranges from about 15 volume % to about 20 volume % and more advantageously, the Sb concentration is about 19 volume %.

In some embodiments of the present invention, ATO films were deposited using a co-sputtering process from a Sb target and a Sn target in a sputtering atmosphere comprising a mixture of Ar and $O_2$. The as deposited resistivity for this set of samples was too high to measure at greater than about 10 $\Omega$cm. The samples were then annealed in air at about 460 C for about 20 minutes. Alternatively, the samples could be formed using reactive sputtering of an alloy target with a mixture of antimony and tin and sputtered in an atmosphere comprising a mixture of $O_2$ and Ar.

The resistivity of annealed ATO is about $4\times10^{-3}$ $\Omega$cm which is similar to that of the AZO material discussed previously, $2\times10^{-3}$ $\Omega$cm. The transmission characteristics in the visible spectrum are also similar between the two materials. Therefore, ATO is a good candidate as a replacement for the AZO TCO layer in TFPV devices.

Figure 2A:
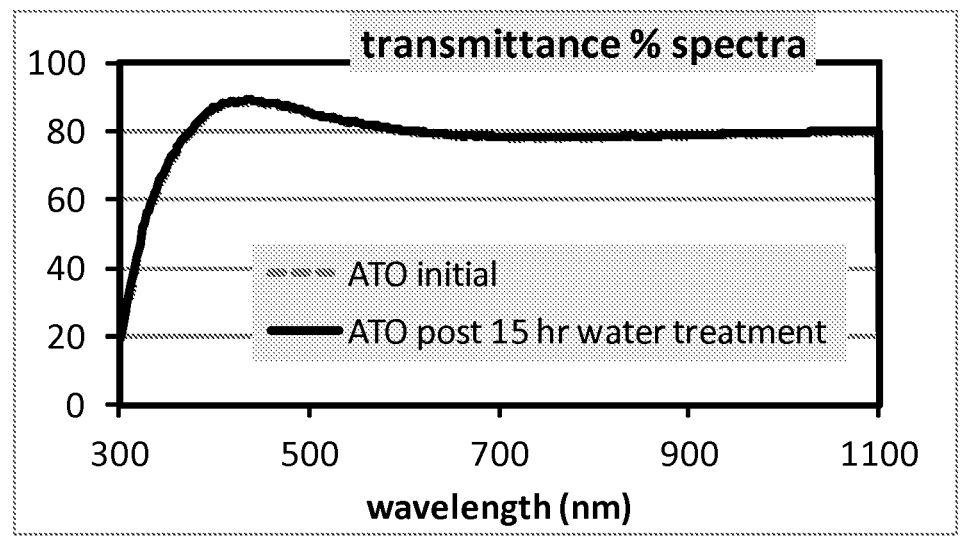
FIGS. 2A-2C present data comparing ATO and AZO TCO materials according to some embodiments described herein.
Figure 2B:
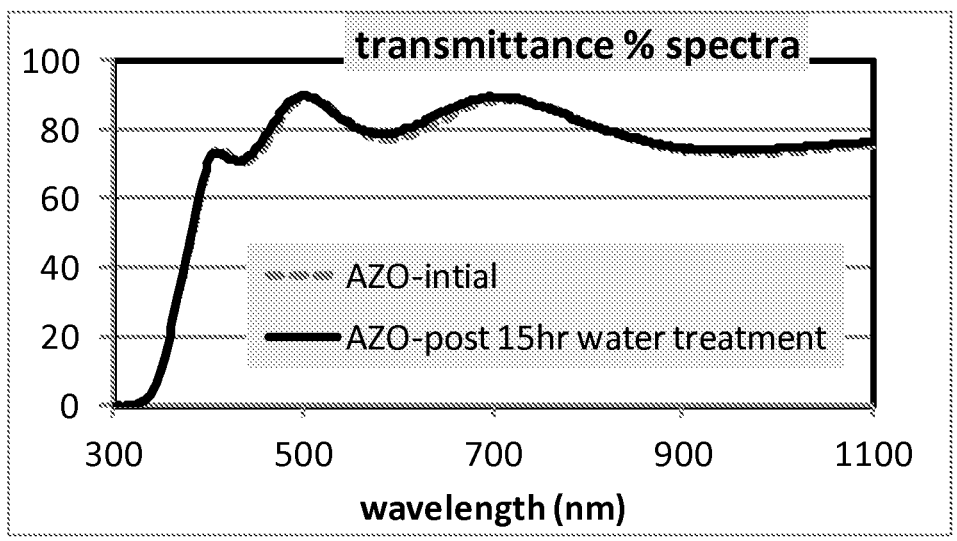

Samples of AZO and ATO were dipped in water for 15 hours to test their stability to moisture exposure. The AZO film was formed from a zinc oxide film doped with 2 weight % Al. FIG. 2A presents transmission data for the AZO film as a function of wavelength from about 300 nm to about 1100 nm. As can be seen from the data, the transmission characteristics of the AZO film did not change after 15 hours of exposure to water.

The ATO film was formed from a tin oxide film doped with 19 volume % Sb. FIG. 2A presents transmission data for the ATO film as a function of wavelength from about 300 nm to about 1100 nm. As can be seen from the data, the transmission characteristics of the ATO film did not change after 15 hours of exposure to water.

Figure 2C:
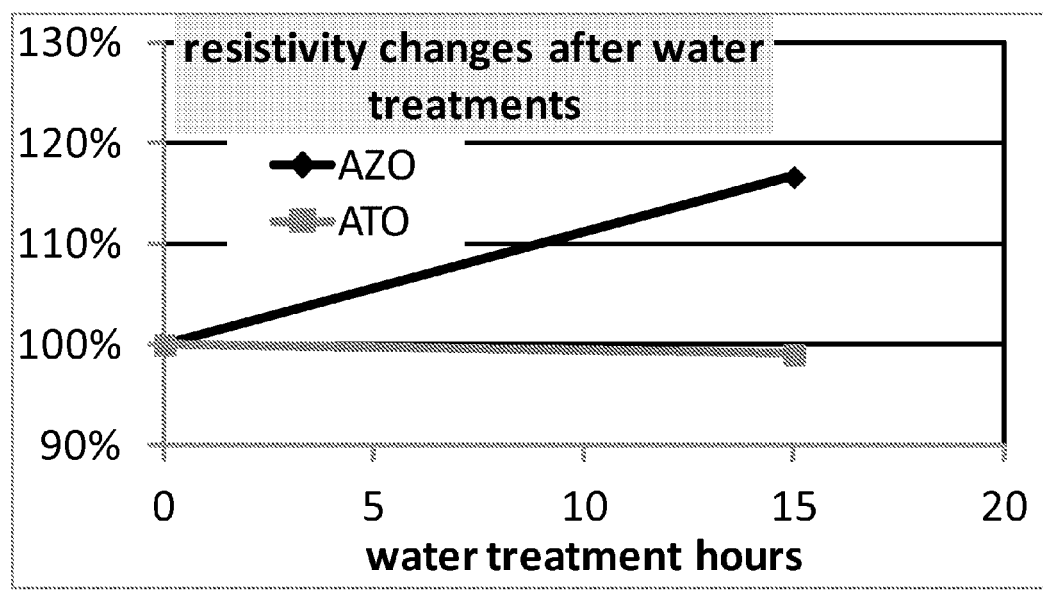
Figure 3A:
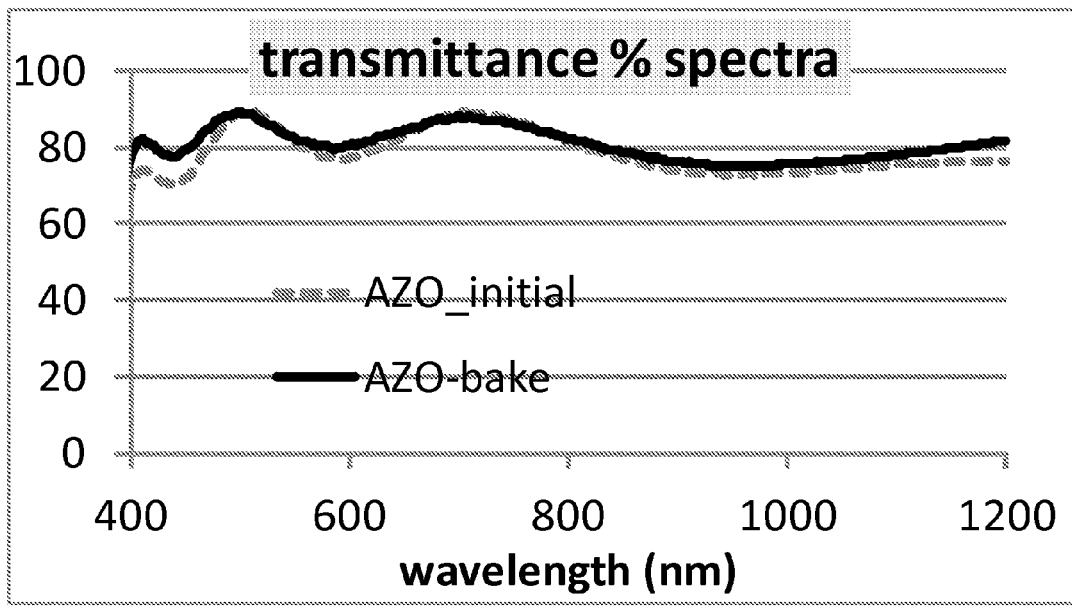
FIGS. 3A-3C present data comparing ATO and AZO TCO materials according to some embodiments described herein.
Figure 3B:
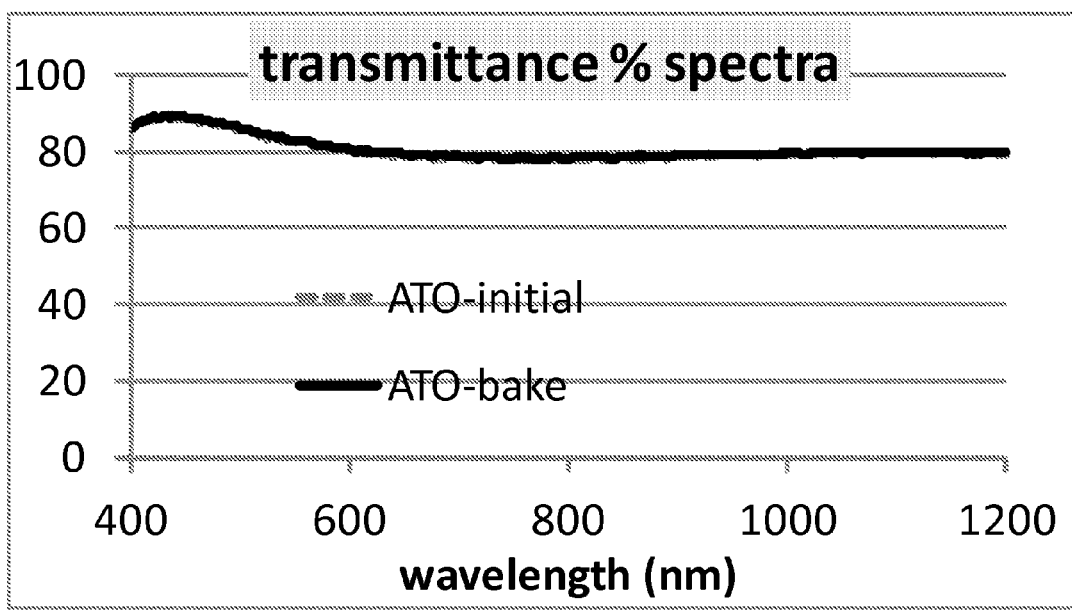
Figure 3C:
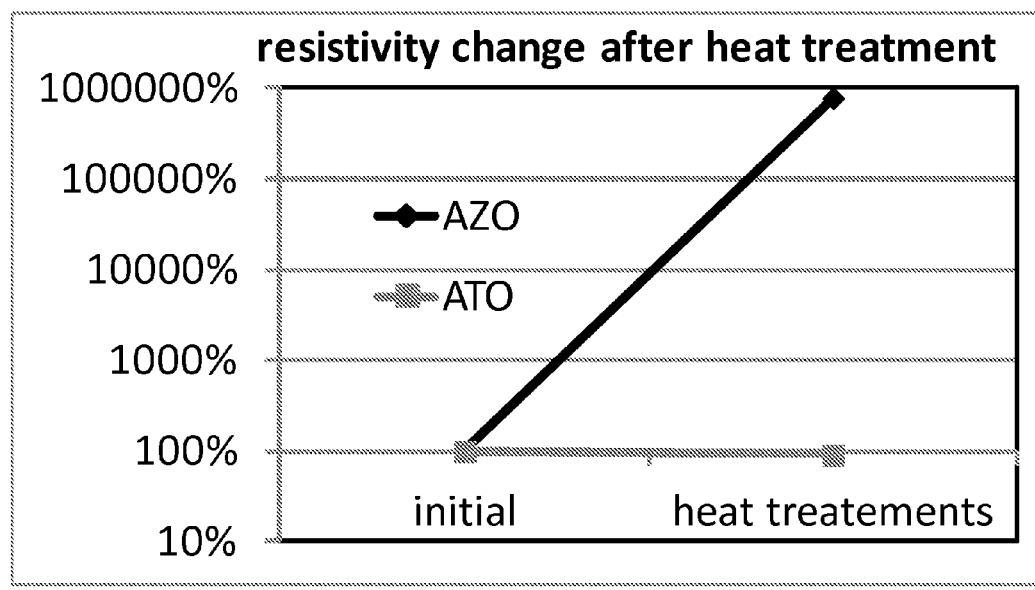

FIG. 2C presents resistivity data for both the AZO film and the ATO film after exposure to water for 15 hours. As can be seen in FIG. 2C, the resistivity of the ATO film did not change after exposure to water for 15 hours while the resistivity of the AZO film increased by almost 20%. This indicates that the AZO film is not stable upon exposure to moisture.

Samples of AZO and ATO were annealed at 650 C in air for 8 minutes to test their stability to high temperature exposure. The AZO film was formed from a zinc Al target with 2 weight % Al reactive sputter to form Zinc Al oxide. FIG. 2A presents transmission data for the AZO film as a function of wavelength from about 300 nm to about 1100 nm. As can be seen from the data, the transmission characteristics of the AZO film did not change after an anneal of 8 minutes at 650 C in air.

The ATO film was formed from a tin oxide film doped with 19 volume % Sb. FIG. 2A presents transmission data for the ATO film as a function of wavelength from about 300 nm to about 1100 nm. As can be seen from the data, the transmission characteristics of the ATO film did not change after an anneal of 8 minutes at 650 C in air.

FIG. 2C presents resistivity data for both the AZO film and the ATO film after an anneal of 8 minutes at 650 C in air. As can be seen in FIG. 2C, the resistivity of the ATO film did not change after an anneal of 8 minutes at 650 C in air while the resistivity of the AZO film increased by almost 780,000%. This indicates that the AZO film is not stable upon an anneal of 8 minutes at 650 C in air.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a thin film photovoltaic device comprising:
   forming a first layer above a substrate, wherein the first layer is operable as a back contact material of the thin film photovoltaic device;
   forming a second layer above the first layer, wherein the second layer is operable as an absorber material of the thin film photovoltaic device;
   forming a third layer above the second layer, wherein the third layer is operable as a buffer material of the thin film photovoltaic device;
   forming a fourth layer above the third layer, wherein the fourth layer is operable as an intrinsic zinc oxide material of the thin film photovoltaic device;
   forming a fifth layer above the fourth layer, wherein the fifth layer is operable as a transparent conductive oxide material of the thin film photovoltaic device, wherein the transparent conductive oxide material comprises a tin oxide material doped with antimony, and wherein the tin oxide material doped with antimony is deposited using a reactive sputtering process; and
   annealing the antimony doped tin oxide material.

2. The method of claim 1 wherein the antimony concentration in the fifth layer ranges from about 5 volume % to about 40 volume %.

3. The method of claim 1 wherein the antimony concentration in the fifth layer ranges from about 15 volume % to about 20 volume %.

4. The method of claim 1 wherein the antimony concentration in the fifth layer is about 19 volume %.

5. The method of claim 1 wherein the reactive sputtering technique used to form the fifth layer uses an antimony target and a tin target.

6. The method of claim 1 wherein the reactive sputtering technique used to form the fifth layer uses an alloy target of antimony and tin.

* * * * *